US011545207B2

(12) United States Patent
Sato

(10) Patent No.: US 11,545,207 B2
(45) Date of Patent: Jan. 3, 2023

(54) SEMICONDUCTOR MEMORY DEVICE

(71) Applicant: Winbond Electronics Corp., Taichung (TW)

(72) Inventor: Takahiko Sato, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/387,757

(22) Filed: Jul. 28, 2021

(65) Prior Publication Data

US 2022/0068362 A1    Mar. 3, 2022

(30) Foreign Application Priority Data

Sep. 3, 2020    (JP) .............................. JP2020-148108

(51) Int. Cl.
*G11C 11/406*    (2006.01)
*G11C 11/4096*    (2006.01)
*G11C 11/4076*    (2006.01)

(52) U.S. Cl.
CPC ..... *G11C 11/40611* (2013.01); *G11C 11/4076* (2013.01); *G11C 11/4096* (2013.01); *G11C 11/40626* (2013.01)

(58) Field of Classification Search
CPC ......... G11C 11/40611; G11C 11/40626; G11C 11/4076; G11C 11/4096; G11C 2211/4061; G11C 11/40615; G11C 11/4078; G11C 2211/4066
USPC ........................................................ 365/222
See application file for complete search history.

(56) References Cited

U.S. PATENT DOCUMENTS

| 7,032,071 | B2 | 4/2006 | Hand et al. |
| 9,741,421 | B1 | 8/2017 | Hedden |
| 10,176,107 | B2 | 1/2019 | Solihin |
| 10,957,376 | B1 * | 3/2021 | Cheng ............... G11C 11/40618 |
| 11,139,016 | B1 * | 10/2021 | Pellizzer ........... G11C 11/40615 |
| 11,482,297 | B2 * | 10/2022 | Lu .................... G11C 29/12015 |
| 2005/0036380 | A1 | 2/2005 | Su |
| 2016/0125931 | A1 | 5/2016 | Doo et al. |
| 2017/0117033 | A1 | 4/2017 | Doo et al. |

(Continued)

FOREIGN PATENT DOCUMENTS

| CN | 107924697 A | 4/2018 |
| JP | 2015-219938 A | 12/2015 |

(Continued)

OTHER PUBLICATIONS

Korean Office Action for Korean Application No. 10-2020-0136360, dated Jul. 30, 2021, with English translation.

*Primary Examiner* — Fernando Hidalgo
(74) *Attorney, Agent, or Firm* — Birch, Stewart, Kolasch & Birch, LLP

(57) ABSTRACT

A semiconductor memory device is provided. The semiconductor memory device can suppress increases in power consumption. As a result, damage to the data normally caused by row hammer problem can be prevented. The semiconductor memory device includes a control unit. The control unit controls a refresh operation for a memory to be performed at any interval, wherein there are a plurality of possible intervals. When read/write access to the memory is required, the control unit controls the refresh operation for the memory to be performed with a shortest interval among the intervals, until a predetermined condition is met.

7 Claims, 8 Drawing Sheets

(56) References Cited

U.S. PATENT DOCUMENTS

2017/0140811 A1   5/2017  Joo
2018/0342283 A1* 11/2018  Lee .................. G11C 11/40611
2020/0027500 A1*  1/2020  Heymann .............. G01K 13/00
2021/0373996 A1* 12/2021  Seo ........................ G11C 29/10

FOREIGN PATENT DOCUMENTS

JP       2016-212934 A   12/2016
JP       2018-198107 A   12/2016
TW        201535366 A    9/2015

* cited by examiner

SEMICONDUCTOR MEMORY DEVICE

CROSS REFERENCE TO RELATED APPLICATIONS

The present application is based on, and claims priority from, Japan Application Serial Number 2020-148108, filed on Sep. 3, 2020, the disclosure of which is hereby incorporated by reference herein in its entirety.

BACKGROUND OF THE INVENTION

Field of the Invention

The present invention relates to a semiconductor memory device.

Description of the Related Art

DRAM (dynamic random access memory) is a volatile memory which stores information by accumulating electric charges in the capacitor. Once the supply of power is interrupted, the stored information is lost. Since the electric charge accumulated in the capacitor is discharged after a certain period of time, the DRAM needs to be charged periodically. This memory-retention operation is called a "refresh".

However, during the refresh period, if the read and/or write access requirements for the same row address are required multiple times, and the read and/or write access requirements for the same row address are required too frequently, "row hammer" may occur. Row hammer is a problem wherein, for a certain period of time, if the read/write access requirements for the same row address are required multiple times, and the read/write access requirements for the same row address are required too frequently, the data will be damaged due to the discharge of the electric charge of the data bit corresponding to the adjacent row address, and the adjacent row address is adjacent to the row address for which the read/write access requirements are required.

FIG. 1 shows an example of the pattern of the read/write access requirement for a semiconductor memory device, and the relationship between the read/write access requirement and the refresh interval. In the example shown in FIG. 1, it is assumed that a refresh is performed after a period of time (at every interval I1). As shown in FIG. 1(a), if read/write access is not required too frequently, the data retention characteristics of the memory will not be damaged. However, as shown in FIG. 1(b), if read/write access is frequently required, the memory's ability to retain data will suffer (i.e. the electric charge of the data bit is discharged), and the data retention time will be shorter. Data damage may occur in this manner.

BRIEF SUMMARY OF THE INVENTION

To solve the problem of row hammer, some people have considered using a shorter refresh interval (I1) for the memory. However, when this is done, the refresh operations are performed frequently, with a very short time interval in between them, and so the power consumption of the semiconductor memory device increases.

The present invention is made in view of the problem mentioned above, and its purpose is to provide a semiconductor memory device that can suppress any increase in power consumption, which can prevent damage to the data caused by row hammer.

To solve the problem mentioned above, the present invention provides a control unit, controlling the refresh operation of a memory to be performed with any interval among a plurality of intervals. When read/write access to the memory is required, the refresh operation for the memory is controlled so that it is performed at the shortest of all the intervals, until a predetermined condition is met.

The semiconductor memory device according to the present invention can suppress any increase in power consumption, which can help protect data from damage due to row hammer.

DETAILED DESCRIPTION OF THE INVENTION

The semiconductor memory device according to the following embodiments of the present invention will be described in detail with reference to the attached drawings. However, the embodiments are illustrative examples, and the present invention is not limited to them.

In addition, the terms such as "first", "second", "third" described in this specification, are used to distinguish a certain component element from other component elements, and are not used to limit the number, the order or the priority of the component elements.

Figure 2:
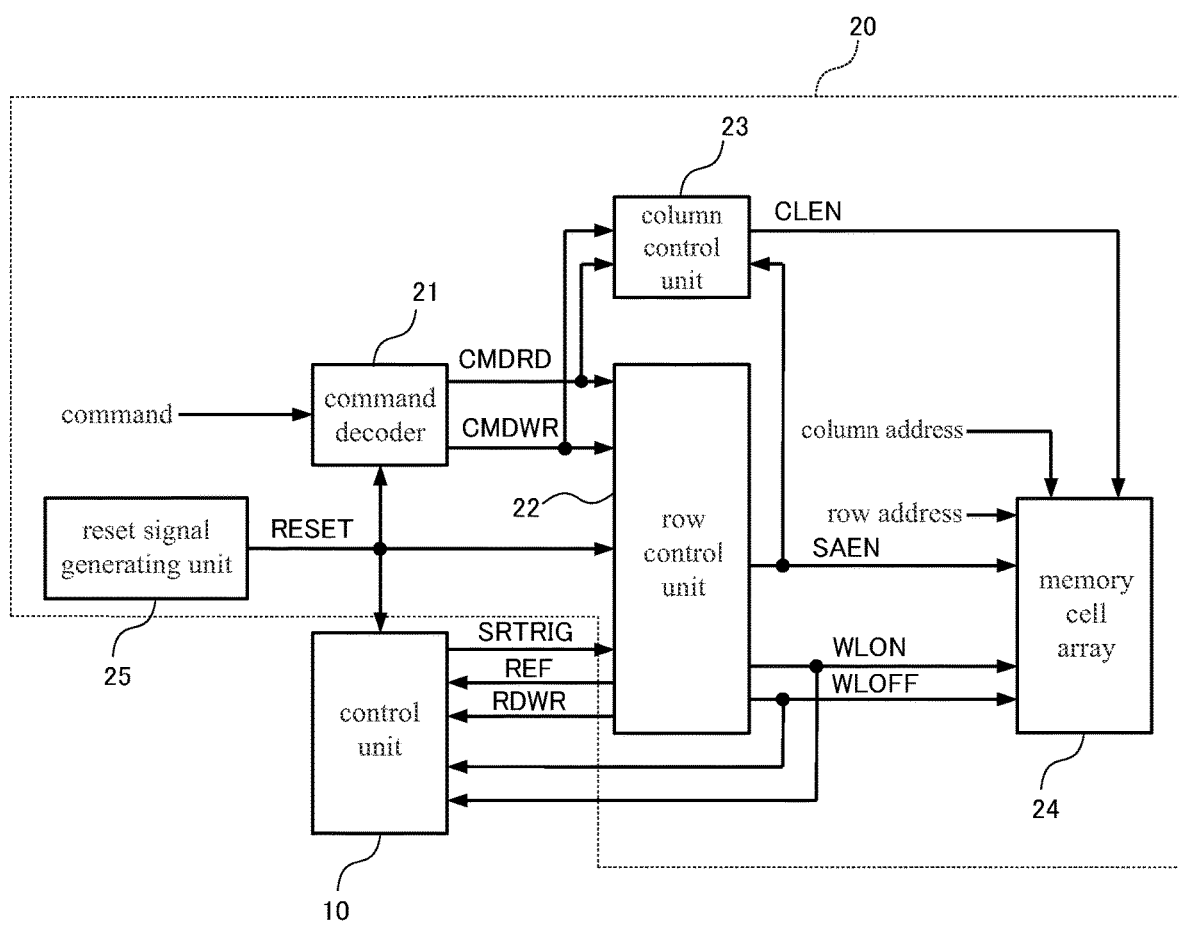
FIG. 2 is a block diagram showing the configuration of the semiconductor memory device according to the first embodiment of the present invention.

FIG. 2 is a block diagram showing the configuration of the semiconductor memory device according to the first embodiment of the present invention. The semiconductor memory device comprises a control unit 10 and a memory 20. The control unit 10 and the memory 20 can be configured by the specific hardware device or the logic circuit.

The semiconductor memory device according to the present embodiment can be a pSRAM (pseudo-Static Random Access Memory) which comprises the control unit 10 and the memory 20, and is configured to control the refresh operation internally. A conventional DRAM, for example, comprises a specific circuit that solves the problem of row hammer by registering the disturb word line address, or using an added refresh operation to recover the data. On the other hand, compared to conventional DRAM, the pSRAM is continually being miniaturized, so it is difficult to make sure that there is sufficient space for such a specific circuit. In addition, if such a specific circuit is configured in the pSRAM, the cost of the pSRAM may be too high.

Therefore, if the semiconductor memory device according to the present invention is the pSRAM, without configuring such a specific circuit, the increase in power consumption can be suppressed, and data damage due to row hammer can be avoided. Therefore the pSRAM is preferable.

Figure 4:
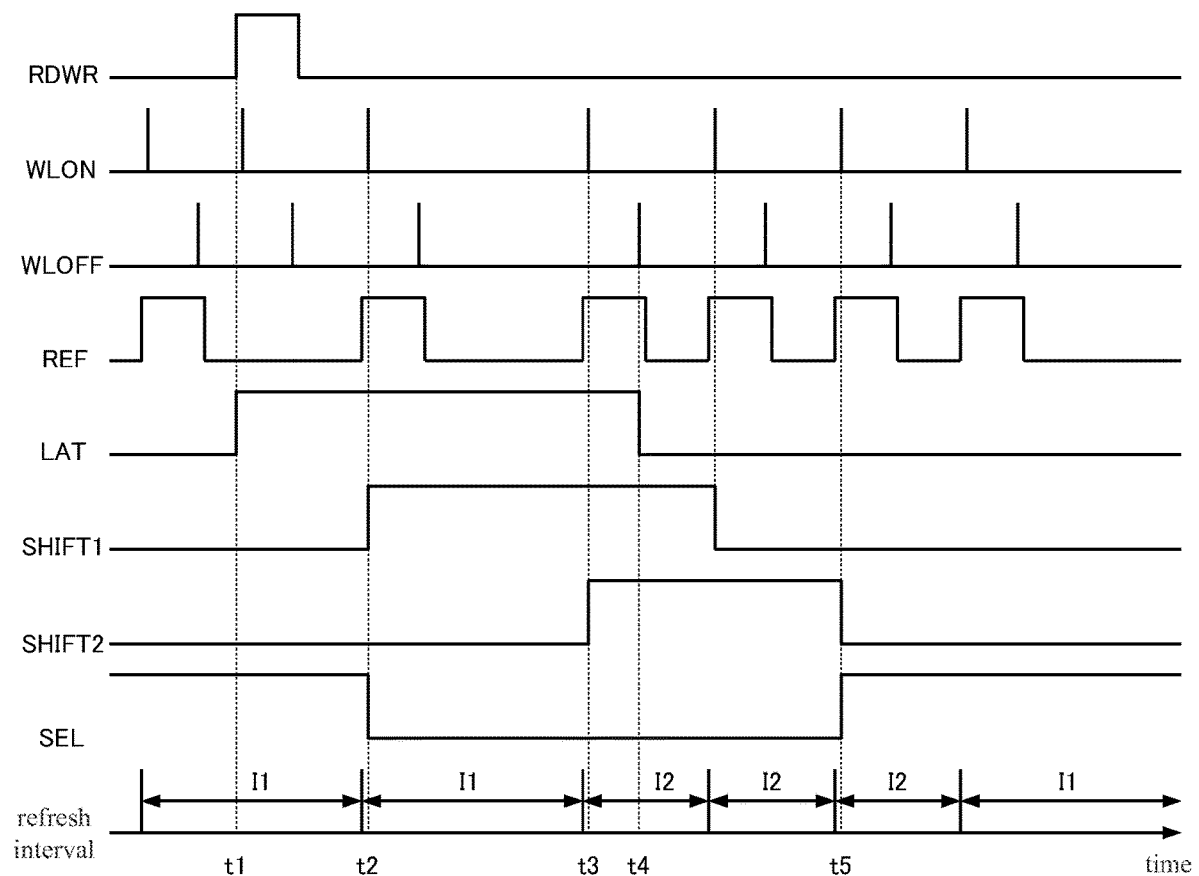
FIG. 4 is a timing chart showing charges in the voltage of the signal of every unit inside the semiconductor memory device.
Figure 5:
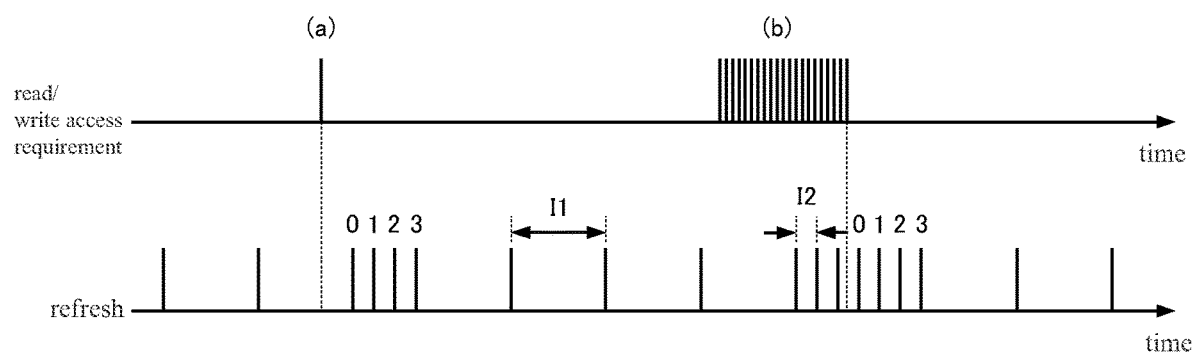
FIG. 5 shows an example of the relationship between the read/write access requirement and the refresh interval according to the first embodiment of the present invention.

The control unit 10 controls the refresh operation for the memory 20 to be performed at any interval (I1) among a plurality of intervals (I1 and I2 shown in FIG. 4 and FIG. 5). When read/write access to the memory 20 is required, the control unit 10 controls the refresh operation for the memory 20 to be performed at the shortest interval (I2) among the intervals, until the predetermined condition is met. The detailed configuration of the control unit 10 will be described later.

Here, the predetermined condition may be that the refresh operation for the memory 20 is performed a predetermined number of times (for example, three times) with the shortest interval (here, I2). This way, before the refresh operation for the memory 20 is performed a predetermined number of times with the shortest interval, the refresh interval for the memory 20 can be shortened.

The memory 20 is the semiconductor (such as the DRAM) that needs to be refreshed. In addition, the memory 20 can also exist outside the semiconductor memory device, and perform signal transmission and reception with the semiconductor memory device.

The configuration of the memory 20 will be described with reference to FIG. 2. The memory 20 comprises: a command decoder 21, a row control unit 22, a column unit 23, a memory cell array 24, and a reset signal generating unit 25. In addition, in order to simplify the description, other well-known structures such as the interface unit (such as the interface pin) for input/output are not shown here.

The command decoder 21 interprets the command signal provided externally, and generates a command control signal. Then, if the command signal provided externally is a read command, the command decoder 21 outputs the trigger signal CMDRD of the read operation to the row control unit 22 and the column control unit 23. In addition, if the command signal provided externally is a write command, the command decoder 21 outputs the trigger signal CMDWR of the write operation to the row control unit 22 and the column control unit 23.

The row control unit 22 controls the corresponding memory array in the memory cell array 24 to activate and deactivate, according to the trigger signals CMDRD, CMDWR and the refresh trigger signal SRTRIG described later. For example, the row control unit 22 outputs the signal WLON and the signal WLOFF to the memory cell array 24 and the control unit 10. The signal WLON is used to activate the row word line; and the signal WLOFF is used to deactivate the row word line. Selecting the row word line is to perform read/write access or the refresh operation.

In addition, the row control unit 22 outputs the signal SAEN for activating the sense amplifier, to the memory cell array 24 and the column control unit 23. In addition, the row control unit 22 outputs the signal RDWR for requiring read/write access, and the signal REF for showing the refresh operation is performed, to the control unit 10. In addition, the row control unit 22 performs the refresh operation on the memory cell array 24 based on the refresh trigger signal SRTRIG output from the control unit 10.

The column control unit 23 outputs the signal CLEN for activating the column bit line to the memory cell array 24 based on the trigger signals CMDRD and CMDWR. Selecting the column bit line is to perform read/write access.

In addition, the address and data control of the memory cell array 24 are also well-known technologies, so descriptions of them are omitted from the present embodiment.

The reset signal generating unit 25 outputs the reset signal RESET to initialize circuits such as logic circuits in the semiconductor memory device, to the control unit 10, the command decoder 21 and the row control unit 22.

In the present embodiment, a memory 20 comprising a command decoder 21, a row control unit 22, a column control unit 23, a memory cell array 24 and a reset signal generating unit 25 is described as an example. However, when the memory 20 exists outside the semiconductor memory device, at least one of the units 21 to 25 can also be configured together with the control unit 10 in the semiconductor memory device, for example.

Figure 3:
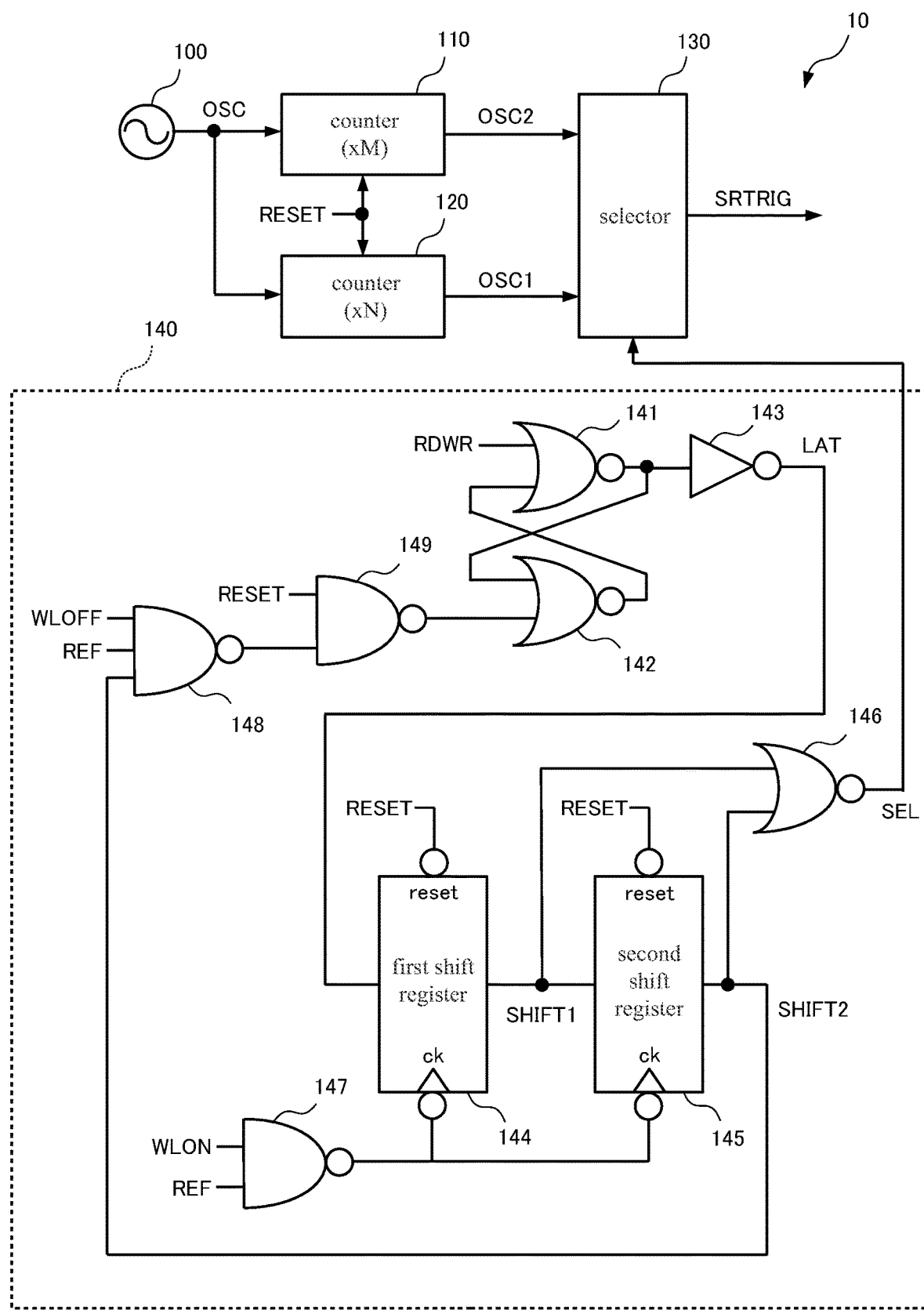
FIG. 3 shows an example of the configuration of the control unit.

Next, the configuration of the control unit 10 will be described with reference to FIG. 3. The control unit 10 comprises an oscillator circuit 100, two counters 110 and 120, a selector 130, and a circuit unit 140. In addition, the reset signal RESET output from the reset signal generating unit 25 can also be input to two counters 110 and 120.

The oscillator circuit 100 generates a refresh trigger signal OSC that starts the refresh operation at a predetermined interval and outputs the refresh trigger signal OSC to two counters 110 and 120.

Whenever the number of pulses of the refresh trigger signal OSC output from the oscillator circuit 100 reaches a count of M (M is any number greater than or equal to 1), the counter 110 outputs one pulse signal to the selector 130 as the refresh trigger signal OSC2. In other words, the interval of the refresh trigger signal OSC2 (here, I2) is M times the interval of the refresh trigger signal OSC.

In addition, whenever the number of iterations of the refresh trigger signal OSC output from the oscillator circuit 100 reaches a count of N (N is any number greater than or equal to 1 and is greater than M), the counter 120 outputs one pulse signal to the selector 130 as the refresh trigger signal OSC1. In other words, the interval of the refresh trigger signal OSC1 (here, I1 is N times the interval of the refresh trigger signal OSC, and is longer than the interval of the refresh trigger signal OSC2.

The selector 130 outputs the refresh trigger signal of any interval (here, OSC1 or OSC2) to the row control unit 22 as the refresh trigger signal SRTRIG based on the control signal SEL described later. In the present embodiment, when the control signal is at the high level, the selector 130 outputs the refresh trigger signal OSC1 with the long interval (I1) to the row control unit 22; when the control signal is at the low level, the selector 130 outputs the refresh trigger signal OSC2 with the short interval (I2) to the row control unit 22.

When read/write access to the memory 20 is required, the circuit unit 140 generates a control signal SEL and outputs the control signal SEL to the selector 130, so that the refresh trigger signal (here, OSC2) with the shortest interval is output from the selector 130, until the predetermined condition is met. In the present embodiment, the circuit unit 140 comprises an RS flip-flop, an inverter 143, a first shift register 144, a second shift register 145, a NOR gate 146, a NAND gate 147, a NAND gate 148 and a NAND gate 149. The RS flip-flop has two NOR gates 141 and 142.

The signal RDWR output from the row control unit 22, is applied to one of the input terminals of the NOR gate 141 of the RS flip-flop. In addition, the other input terminal of the NOR gate 141 is connected to the output terminal of the NOR gate 142. In addition, the output terminal of the NOR gate 141 is connected to the input terminal of the inverter 143, and is connected to one of the input terminals of the NOR gate 142. In addition, the other input terminal of the NOR gate 142 is connected to the output terminal of the NAND gate 149.

The inverter 143 logically inverts the signal output from the NOR gate 141 and outputs the signal inverted logically to the first shift register 144 as the signal LAT.

The first shift register 144 uses the clock signal to shift the signal LAT output from the inverter 143 as the signal SHIFT1 and outputs the signal SHIFT1 to the second shift register 145 and the NOR gate 146. In addition, the reset signal RESET output from the reset signal generating unit 25 can also be applied to the reset terminal (reset) of the first shift register 144.

The second shift register 145 uses the clock signal to shift the signal SHIFT1 output from the first shift register 144 as the signal SHIFT2 and outputs the signal SHIFT2 to the NOR gate 146 and the NAND gate 148. In addition, the reset signal RESET output from the reset signal generating unit 25 can also be applied to the reset terminal (reset) of the second shift register 145.

One of the input terminals of the NOR gate 146 is connected to the output terminal of the first shift register 144. In addition, the other input terminal of the NOR gate 146 is connected to the output terminal of the second shift register 145. In addition, the result of the logic operation in the NOR gate 146, is output to the selector 130 as the control signal SEL.

The signal WLON output from the row control unit 22 is applied to one of the input terminals of the NAND gate 147. In addition, the signal REF output from the row control unit 22 is applied to the other input terminal of the NAND gate 147. In addition, the signal output from the NAND gate 147, is applied to the clock signal terminal (ck) of the first shift register 144 and the clock signal terminal (ck) of the second shift register 145.

The signal WLOFF output from the row control unit 22 is applied to the first input terminal of the NAND gate 148. In addition, the signal REF output from the row control unit 22 is applied to the second input terminal of the NAND gate 148. In addition, the signal SHIFT2 output from the second shift register 145 is applied to the third input terminal of the NAND gate 148.

The reset signal RESET output from the reset signal generating unit 25, is applied to one side of the input terminals of the NAND gate 149. In addition, the other side of the input terminals of the NAND gate 149 is connected to the output terminal of the NAND gate 148.

Next, the operation of the semiconductor memory device according to the present embodiment will be described with reference to FIG. 4. FIG. 4 is a timing chart showing charges in the voltage of the signal of every unit inside the semiconductor memory device.

As shown in FIG. 4, in the standby state, by inputting the control signal SEL at the high level to the selector 130, the refresh trigger signal OSC1 with the long interval I1 is output to the row control unit 22. This way, the row control unit 22 performs the refresh operation with the interval I1.

At time t1, by requiring read/write access, when the signal RDWR at the high level is output from the row control unit 22 and is input to the NOR gate 141 of the RS flip-flop, the RS flip-flop outputs the signal at the low level. In this case, the inverter 143 outputs the signal LAT inverted logically from the low level to the high level to the first shift register 144.

Then, as the refresh operation (the refresh operation of the second interval I1 in the figure) with the interval I1 starts, at time t2, when the signal REF and the signal WLON change to the high level, the signal at the low level output from the NAND gate 147 is input to the clock signal terminal of the first shift register 144. This allows the signal SHIFT1 output from the first shift register 144 to change to the high level. At this time, the control signal SEL output from the NOR gate 146 changes to the low level, and the next refresh operation will be performed at interval I2.

Next, as the first time the refresh operation with the interval I2 starts, when the signal REF and the signal WLON change to the high level at time t3, the signal at the low level output from the NAND gate 147 is input to the clock signal terminal of the second shift register 145. This allows the signal SHIFT2 output from the second shift register 145 to change to the high level.

Then, at time r4, in case that the signal SHIFT2 changes to the high level, when the signal WLOFF changes to the high level, the signal LAT changes to the low level. Then, through the next two refresh operations with the interval I2, the signal LAT at the low level is shifted to the second shift register 145.

Then, as the third time the refresh operation with the interval I2 starts, at time t5, when the when the signal REF and the signal WLON change to the high level, the signal SHIFT2 changes to the low level, the control signal SEL output from the NOR gate 146 changes to the high level. This way, the next refresh operation will be performed with the interval I1.

Here, even if the signal LAT is at the low level, when read/write access is required before the signal SHIFT2 changes to the low level, the signal LAT will still change to the high level same as at time t1, is will be input to the first shift register. In other words, the control signal SEL can be kept at the low level, until the third time the refresh operation with the interval I2 is performed after the latest read/write access is required (in other words, the refresh trigger signal OSC2 with the short interval (I2) is input from the selector 130 to the control unit 22).

This way, when read/write access to the memory 20 is required, the control unit 10 can control the refresh operation for the memory 20 to be performed with the shortest interval (I2), until the predetermined condition (here, to perform the refresh operation three times with the shortest interval I2) is satisfied.

Figure 1:
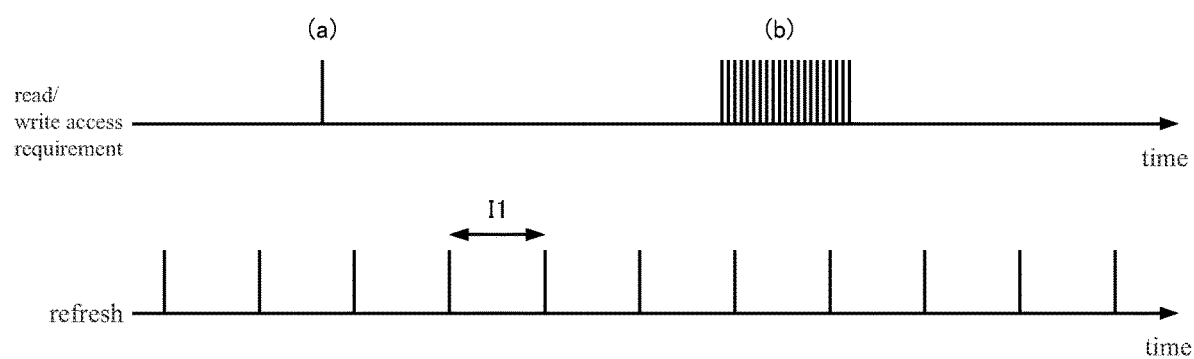
FIG. 1 shows an example of the relationship between the read/write access requirement and the refresh interval for the conventional semiconductor memory device.

FIG. 5 shows an example of the pattern of the read/write access requirement for the semiconductor memory device, and the relationship between the read/write access requirement and the refresh interval according to the first embodiment. As shown in FIG. 5(a), if read/write access is not required as frequently as in FIG. 1(a), the number of times that the refresh operation needs to be performed is increased. However, if power consumption due to read/write access is taken into consideration, the increase in power consumption according to the increase in the number of times the refresh operation is performed is tolerable. In addition, as shown in FIG. 5(b), although read/write access is required frequently, the period during the refresh operation is performed with the shortest interval (I2) can be lengthened according to such the frequent read/write access. This way, since the refresh interval for each row address is shortened, for example, even if read/write access which is needed due to the row hammer attack for a particular row address, the time to refresh the particular row address again after refreshing other row addresses can be shortened. Therefore, during each of the row addresses, the number of times that a read/write access is needed due to a row hammer attack on a particular row address is also reduced. Therefore, data retention can be maintained.

As described above, according to the semiconductor memory device of the present embodiment, when read/write access to the memory 20 is required, the refresh operation for the memory is performed with the shortest interval I2, until the predetermined condition is met. Therefore, for example, although read/write access is required frequently, the refresh operation for the memory can be performed frequently in response to this. Therefore, data damage due to a row hammer can be avoided. In addition, if read/write access is not required, the refresh operation for the memory can be performed with an interval I1 which is longer than the shortest interval I2. Therefore, for example, compared with the case that the refresh operation for the memory is often performed with the shortest interval I2, the number of times that the refresh operation needs to be performed can be reduced. Therefore, any increase in power consumption of the semiconductor memory device can be suppressed.

In addition, according to the semiconductor memory device 20 of the present embodiment, the refresh trigger signal OSC2 of the shortest interval I2 is output from the selector 130, until the predetermined condition is met. This allows the refresh interval to be controlled.

Next, the second embodiment of the present invention will be described. The difference from the first embodiment is that the semiconductor memory device of the present embodiment controls the refresh interval according to the temperature of the semiconductor memory device. Next, the configuration different from the first embodiment will be described.

Figure 6:
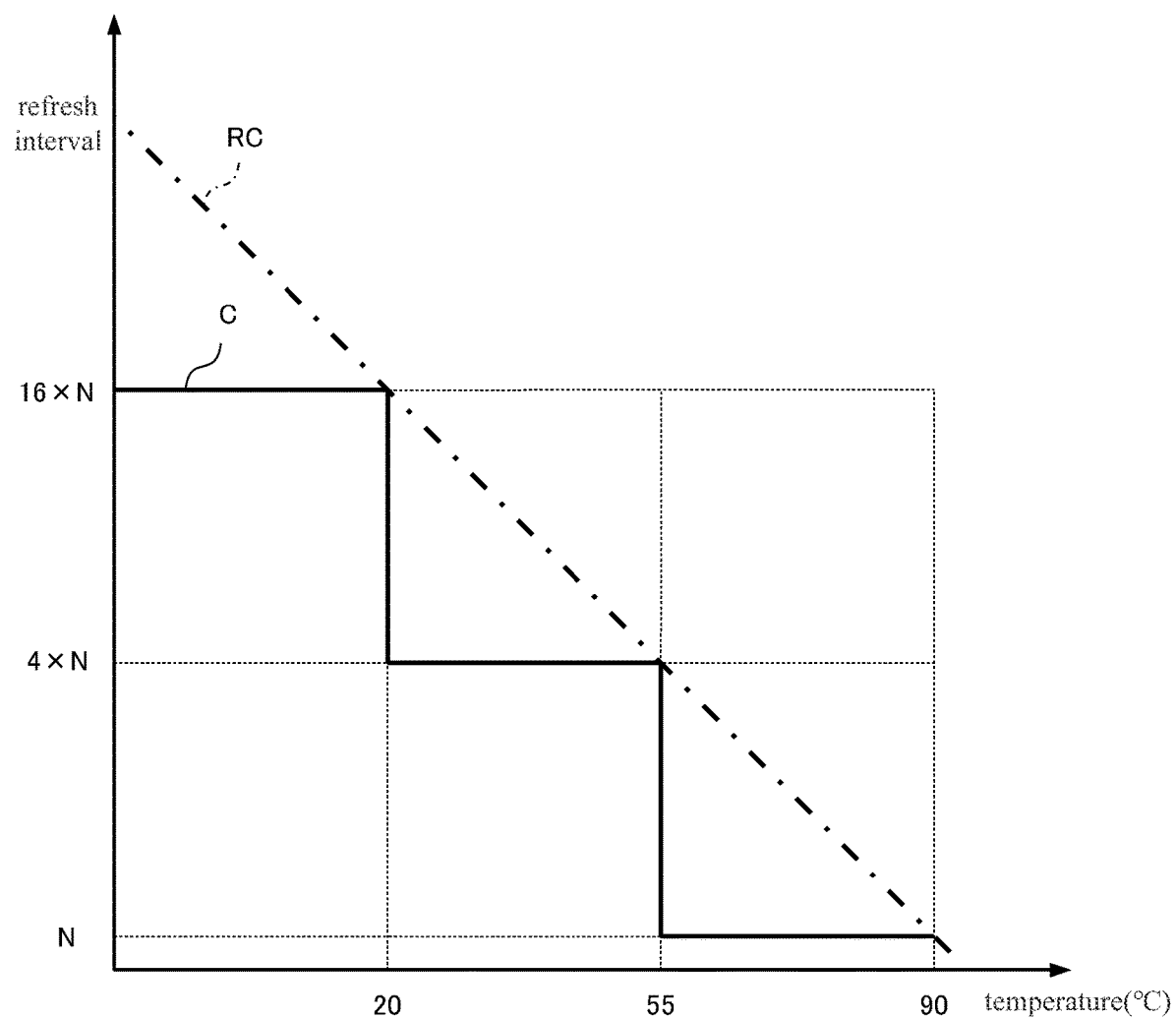
FIG. 6 shows an example of the relationship between the temperature of the semiconductor memory device and the refresh interval according to the second embodiment of the present invention.

FIG. 6 shows an example of the relationship between the temperature of the semiconductor memory device and the refresh interval according to the second embodiment. Generally, the semiconductor memory device has a characteristic RC: That is, if the temperature is higher, the refresh interval for the semiconductor memory device to retain the data properly is shorter. Here, if the refresh interval in the predetermined temperature (for example, 20° C.) is longer than the refresh interval of the characteristic RC, then the data may be lost during the refresh operation. Therefore, it is necessary to control the refresh interval according to the temperature of the semiconductor memory device, so that the refresh interval in the predetermined temperature is smaller than the refresh interval of the characteristic RC.

Therefore, as shown in FIG. 6, the semiconductor memory device of the present embodiment sets different refresh intervals (in the figure, 16×N, 4×N, N) to different temperature ranges (in the figure, less than 20° C., greater than or equal to 20° C. and less than 55° C., greater than or equal to 55° C. and less than 90° C.).

Figure 7:
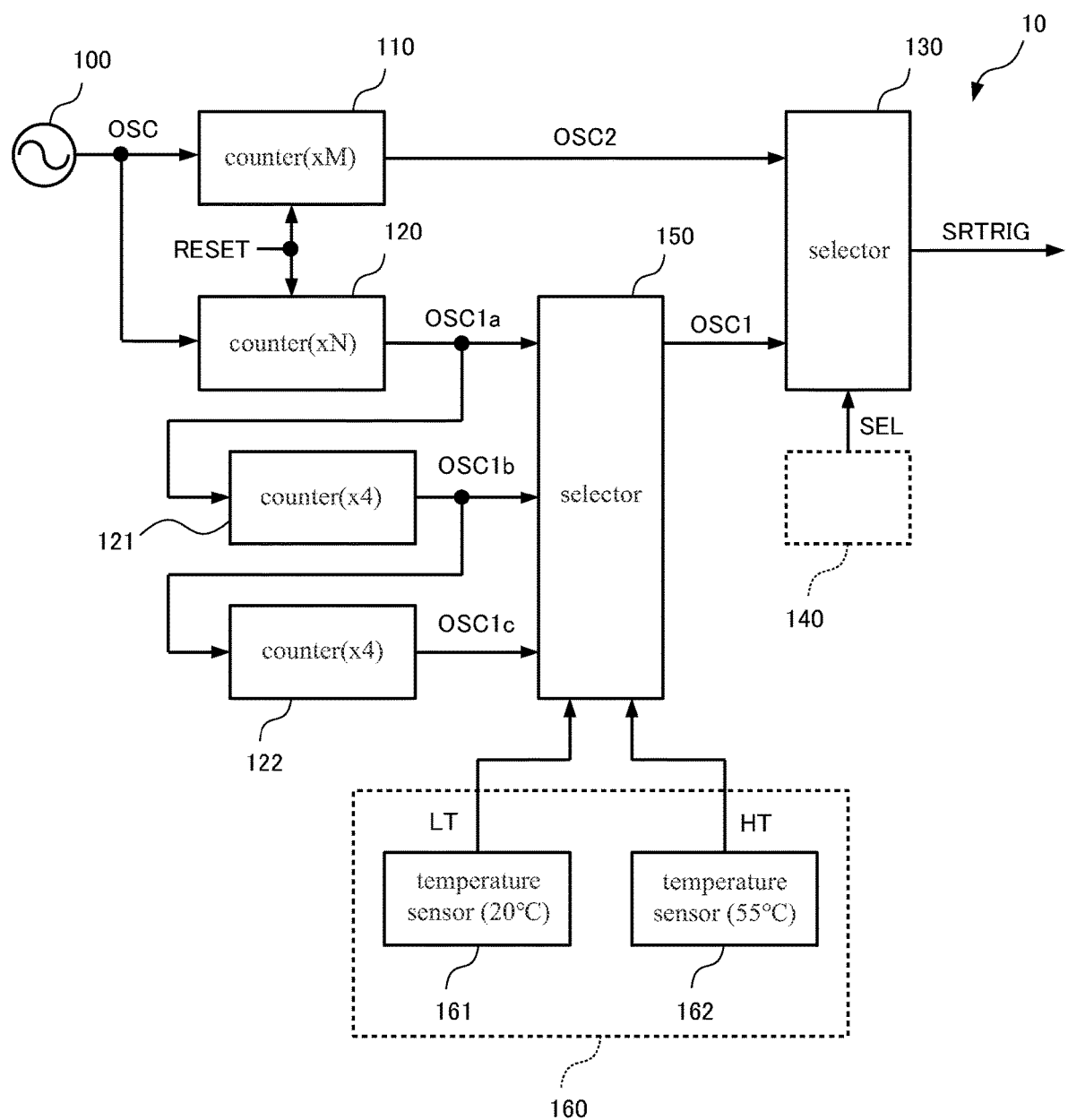
FIG. 7 shows an example of the configuration of the control unit of the semiconductor memory device according to the second embodiment of the present invention.

FIG. 7 shows an example of the configuration of the control unit 10 of the semiconductor memory device according to the present embodiment. The semiconductor memory device according to the present embodiment comprises a temperature sensor 160. The temperature sensor 160 detects the temperature of the semiconductor memory device. When any one of the intervals (here, 16×N, 4×N, N) corresponds to the temperature of the semiconductor memory device, the control unit 10 controls the refresh operation for the memory 20 to be performed with the interval corresponding to the temperature detected by the temperature sensor 160. This way, the refresh interval can be shortened or lengthened according to the temperature of the semiconductor memory device. Therefore, the data can be retained properly according to the temperature of the semiconductor memory device.

In addition, the control unit 10 can also control the refresh operation for the memory 20 to be performed with the shorter interval if the temperature detected by the temperature sensor 160 is higher. For example, the refresh operation is performed with the shorter interval if the temperature of the semiconductor memory device is higher. Therefore, the data can be retained properly according to the temperature of the semiconductor memory device.

In the present embodiment, the control unit 10 comprises: an oscillator circuit 100, four counters 110, 120, 121 and 122, a selector 130, a circuit unit 140, a selector 150, and a temperature sensor 160. Here, the selector 150 is one example of the "first selector" of the present invention, and the selector 130 is one example of the "second selector" of the present invention.

In the present embodiment, whenever the number of iterations of the refresh trigger signal OSC output from the oscillator circuit 100 reaches a count of N, the counter 120 outputs one pulse signal to the selector 150 and the counter 121 as the refresh trigger signal OSC1a. Here, the interval of the refresh trigger signal OSC1a (here, N) is N times the interval of the refresh trigger signal OSC.

Whenever the number of iterations of the refresh trigger signal OSC1a output from the counter 120 reaches a predetermined number (For example, 4), the counter 121 outputs one pulse signal to the selector 150 and the counter 122 as the refresh trigger signal OSC1b. Here, the interval of the refresh trigger signal OSC1b (here, 4×N) is 4×N times the interval of the refresh trigger signal OSC.

Whenever the number of iterations of the refresh trigger signal OSC1b output from the counter 121 reaches a predetermined number (For example, 4), the counter 122 outputs one pulse signal to the selector 150 as the refresh trigger signal OSC1c. Here, the interval of the refresh trigger signal OSC1c (here, 16×N) is 16×N times the interval of the refresh trigger signal OSC.

The selector 150 outputs the refresh trigger signal (here, OSC1a, OSC1b or OSC1c) corresponding to the temperature detected by the temperature 160 among the intervals (here, 16×N, 4×N, N) to the selector 130 as the refresh trigger signal OSC1.

The temperature sensor 160 comprises two temperature sensors 161 and 162. The temperature sensors 161 and 162 detect the temperature of the semiconductor memory device. When the detected temperature is less than or equal to the predetermined value (here, 20° C.), the temperature sensor 161 outputs the signal LT at the low level to the selector 150; when the detected temperature is greater than the predetermined value (here, 20° C.), the temperature sensor 161 outputs the signal LT at the high level to the selector 150. In addition, when the detected temperature is less than or equal to the predetermined value (here, 55° C.), the temperature sensor 162 outputs the signal HT at the low level to the selector 150; when the detected temperature is greater than the predetermined value (here, 55° C.), the temperature sensor 162 outputs the signal HT at the high level to the selector 150.

In the present embodiment, if the temperature detected by the temperature sensor 160 is less than 20° C. (both the signal LT and the signal HT is at the low level), the selector 150 outputs the refresh trigger signal OSC1c of the interval 16×N to the selector 130 as the refresh trigger signal OSC1. In addition, if the temperature detected by the temperature sensor 160 is greater than or equal to 20° C. and less than 55° C. (the signal LT is at the high level, and the signal HT is at the low level), the selector 150 outputs the refresh trigger signal OSC1b of the interval 4×N to the selector 130 as the refresh trigger signal OSC1. In addition, if the temperature detected by the temperature sensor 160 is greater than 55° C. (both the signal LT and the signal HT is at the high level), the selector 150 outputs the refresh trigger signal OSC1a of the interval N to the selector 130 as the refresh trigger signal OSC1.

In addition, similar to the first embodiment described above, if the control signal SEL output from the circuit unit 140 is at the high level, the selector 130 outputs the refresh trigger signal OSC1 to the row control unit 22 as the refresh trigger signal SRTRIG. In addition, if the control signal SEL output from the circuit unit 140 is at the low level (in other words, the period from read/write access to the memory 20 is required, until the predetermined condition is met), the selector 130 outputs the refresh trigger signal OSC2 to the row control unit 22 as the refresh trigger signal SRTRIG.

As described above, according to the semiconductor memory device of the present embodiment, the data can be retained properly according to the temperature of the semiconductor memory device, the increase in power consumption can be suppressed, and data damage due to row hammer can be avoided.

Next, the third embodiment of the present invention will be described. The difference from the above embodiments is that when read/write access to the memory 20 is required, the semiconductor memory device of the present embodiment controls the refresh trigger signal of the shortest of the intervals corresponding to the temperature detected by the temperature sensor to be output from the selector 150. Next, the configuration different from the above embodiments will be described.

Figure 8:
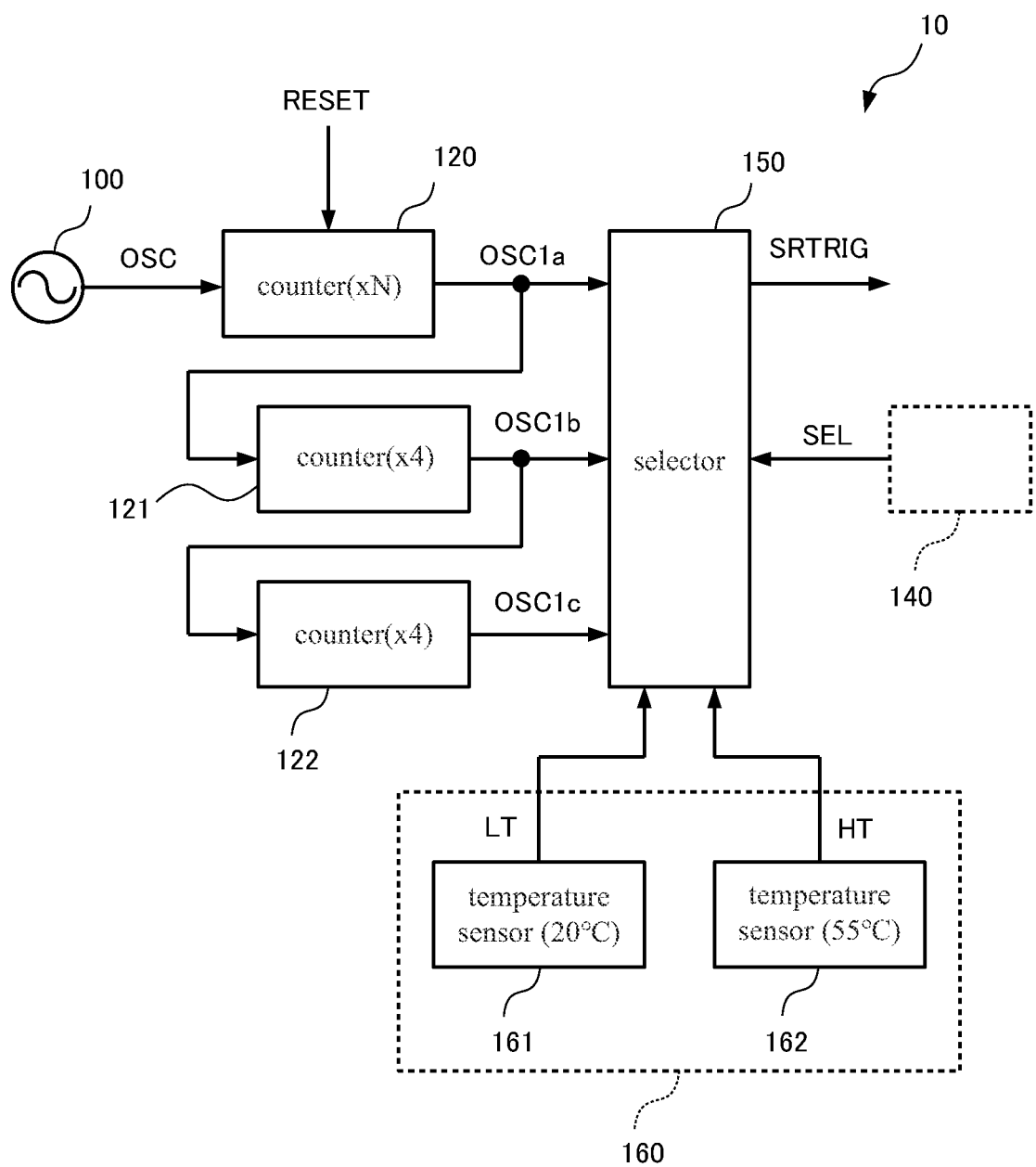
FIG. 8 shows an example of the configuration of the control unit of the semiconductor memory device according to the third embodiment of the present invention.

FIG. 8 shows an example of the configuration of the control unit 10 of the semiconductor memory device according to the present embodiment. In the present embodiment, the control unit 10 comprises: an oscillator circuit 100, three counters 120, 121 and 122, a circuit unit 140, a selector 150 and a temperature sensor 160. In the present embodiment, the control signal SEL output from the circuit unit 140 is applied to the selector 150.

In the present embodiment, the selector 150 outputs the refresh trigger signal of the interval corresponding to the temperature detected by the temperature sensor 160 among the intervals based on the control signal SEL.

Specifically, if the control signal SEL output from the circuit unit 140 is at the high level, the selector 150 outputs the refresh trigger signal (here, OSC1a, OSC1b or OSC1c) corresponding to the temperature detected by the temperature 160 among the intervals (here, 16×N, 4×N, N) to the row control unit 22 as the refresh trigger signal SRTRIG.

In addition, if the control signal SEL output from the circuit unit 140 is at the low level (in other words, the period from read/write access to the memory 20 is required, until the predetermined condition is met), the selector 150 outputs the refresh trigger signal (here, OSC1a) of the shortest interval (here, N) among the intervals (here, 16×N, 4×N, N) to the row control unit 22 as the refresh trigger signal SRTRIG.

As described above, according to the semiconductor memory device of the present embodiment, the data can be retained properly according to the temperature of the semiconductor memory device, the increase in power consumption can be suppressed, and data damage due to row hammer can be avoided.

The embodiments described above are described in order to easily understand the present invention, and are not described in order to limit the present invention. Therefore, the elements disclosed in the above embodiments are intended to comprise all the design modifications or equivalents pertaining to the technical field of the present invention.

For example, in the embodiments described above, one example describes that the predetermined condition is that the refresh operation for the memory 20 is performed the predetermined number of times with the shortest interval; however, the present invention is not limited to this. For example, the predetermined condition can also be that a predetermined amount of time has passed after read/write access was required; or it may be that a dedicated counter is counting the number of pulses output from a predetermined oscillator circuit (which can be the oscillator circuit 100, or it can be another oscillator circuit), and that the count value has reached a predetermined value.

In addition, in the embodiments described above, one example describes that when read/write access is required, the refresh operation for the memory 20 is performed three times with the shortest interval; however, the present invention is not limited to this. For example, when read/write access is required, the refresh operation for the memory 20 can also be performed once, twice, or at least four times with the shortest interval. In this case, for example, the number of the shift registers of the circuit unit 140 can be modified according to the number of times that the refresh operation is performed with the shortest interval. In addition, a counter can be configured to set the number of times that the refresh operation is performed with the shortest interval to replace the shift register.

In addition, in the second embodiment and the third embodiment described above, one example describes that the refresh intervals are set in three different temperature ranges; however, the present invention is not limited to this. For example, the refresh intervals can also be set in two different temperature ranges, or be set in at least four different temperature ranges. In this case, the number of the temperature sensors can be configured according to the number of temperature ranges.

What is claimed is:

1. A semiconductor memory device, comprising:
a control unit, controlling a refresh operation for a memory, wherein when read/write access to the memory is required, the control unit controls the refresh operation for the memory to be performed with a shortest interval among a plurality of intervals, until a predetermined condition is met, and wherein when the predetermined condition is met and no read/write access to the memory is required, the control unit controls the refresh operation for the memory to be performed with an interval, longer than the shortest interval, among the plurality of intervals.

2. The semiconductor memory device as claimed in claim 1,
wherein the predetermined condition is that the refresh operation for the memory is performed a predetermined number of times with the shortest interval.

3. The semiconductor memory device as claimed in claim 1,
wherein the control unit comprises:
a selector, outputting a refresh trigger signal of any interval among the intervals based on a control signal; and a circuit unit, when read/write access to the memory is required, generating the control signal and outputting the control signal to the selector, so that the refresh trigger signal of the shortest interval is output from the selector, until the predetermined condition is met.

4. The semiconductor memory device as claimed in claim 1, further comprising:
a temperature sensor, detecting a temperature of the semiconductor memory device;
wherein when any interval among the intervals corresponds to the temperature of the semiconductor memory device, the control unit controls the refresh operation for the memory to be performed with an interval corresponding to the temperature detected by the temperature sensor.

5. The semiconductor memory device as claimed in claim 4,
wherein the control unit comprises:
a first selector, outputting a refresh trigger signal of the interval corresponding to the temperature detected by the temperature sensor among the intervals;
a second selector, outputting the refresh trigger signal of the interval corresponding to the temperature detected by the temperature sensor based on a control signal, or outputting the refresh trigger signal of the shortest interval based on the control signal; and
a circuit unit, when read/write access to the memory is required, generating the control signal and outputting the control signal to the second selector, so that the refresh trigger signal of the shortest interval is output from the second selector, until the predetermined condition is met.

6. The semiconductor memory device as claimed in claim 4,
wherein the control unit comprises:
a selector, outputting a refresh trigger signal of the interval corresponding to the temperature detected by the temperature sensor among the intervals based on a control signal; and
a circuit unit, when read/write access to the memory is required, generating the control signal and outputting the control signal to the selector, so that the refresh trigger signal of the shortest interval is output from the selector, until the predetermined condition is met.

7. The semiconductor memory device as claimed in claim 4,
wherein the control unit controls the refresh operation for the memory to be performed with the shorter interval if the temperature detected by the temperature sensor is higher.

* * * * *